United States Patent
Rizzardini et al.

(10) Patent No.: US 12,143,764 B2
(45) Date of Patent: Nov. 12, 2024

(54) INPUT DETECTION WITH ELECTROSTATIC CHARGE SENSORS

(71) Applicant: STMICROELECTRONICS S.r.l., Agrate Brianza (IT)

(72) Inventors: Federico Rizzardini, Settimo Milanese (IT); Lorenzo Bracco, Chivasso (IT); Andrea Labombarda, Milan (IT); Mauro Bardone, Cava Manara (IT); Stefano Paolo Rivolta, Desio (IT); Federico Iaccarino, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 343 days.

(21) Appl. No.: 17/686,322

(22) Filed: Mar. 3, 2022

(65) Prior Publication Data

US 2023/0283939 A1    Sep. 7, 2023

(51) Int. Cl.
*H04R 1/10*    (2006.01)
*G06F 3/044*    (2006.01)
*H03K 17/96*    (2006.01)

(52) U.S. Cl.
CPC ........... *H04R 1/1041* (2013.01); *G06F 3/044* (2013.01); *H03K 17/962* (2013.01); *H04R 1/1016* (2013.01); *H03K 2017/9613* (2013.01)

(58) Field of Classification Search
CPC ..... H04R 1/1041; H04R 1/1016; G06F 3/044; G06F 3/04883; H03K 17/962; H03K 2017/9613; H03K 2017/9602; H03K 2217/96066; G01R 29/24
See application file for complete search history.

(56) References Cited

U.S. PATENT DOCUMENTS

| | | | |
|---|---|---|---|
| 9,110,545 B2* | 8/2015 | Radivojevic | G06F 3/016 |
| 10,617,297 B2* | 4/2020 | Turner | A61B 5/0006 |
| 10,812,888 B2* | 10/2020 | Ueda | G06F 3/017 |
| 2008/0130910 A1* | 6/2008 | Jobling | H04M 1/05 |
| | | | 381/74 |
| 2010/0292945 A1* | 11/2010 | Reynolds | H03K 17/9622 |
| | | | 702/65 |
| 2014/0232516 A1* | 8/2014 | Stivoric | G16H 40/67 |
| | | | 340/3.1 |
| 2016/0342781 A1* | 11/2016 | Jeon | G06V 40/1365 |
| 2019/0155415 A1 | 5/2019 | Kato et al. | |
| 2019/0297408 A1* | 9/2019 | Mohammadi | H04R 1/1016 |
| 2020/0314527 A1* | 10/2020 | Guo | H04R 11/00 |
| 2021/0014598 A1* | 1/2021 | Pine | H04R 1/1041 |
| 2021/0232227 A1* | 7/2021 | Passaniti | G06F 3/044 |
| 2021/0285773 A1* | 9/2021 | Alessi | G01C 21/206 |

(Continued)

FOREIGN PATENT DOCUMENTS

| CN | 110505550 A | 11/2019 |
|---|---|---|
| CN | 111366175 A | 7/2020 |
| CN | 111757203 A | 10/2020 |

(Continued)

*Primary Examiner* — Oyesola C Ojo
(74) *Attorney, Agent, or Firm* — Seed IP Law Group LLP

(57) ABSTRACT

The present disclosure is directed to input detection for electronic devices using electrostatic charge sensors. The devices and methods disclosed herein utilize electrostatic charge sensors to detect various touch gestures, such as long and short touches, single/double/triple taps, and swipes; and perform in-ear detection.

19 Claims, 9 Drawing Sheets

(56) References Cited

U.S. PATENT DOCUMENTS

2021/0342032 A1\* 11/2021 Guo ..................... G06F 3/0443
2022/0326806 A1    10/2022 Rizzardini et al.

FOREIGN PATENT DOCUMENTS

| CN | 112738679 | A | \* | 4/2021 | ........... H04R 1/1041 |
| CN | 113613138 | A | | 11/2021 | |
| EP | 2980609 | A1 | | 2/2016 | |
| KR | 20110061750 | A | | 6/2011 | |

\* cited by examiner

INPUT DETECTION WITH ELECTROSTATIC CHARGE SENSORS

BACKGROUND

Technical Field

The present disclosure is directed to input detection for electronic devices.

Description of the Related Art

Many electronic devices are capable of performing various types of user input detection to allow a user to interact with the device. For example, portable audio devices, such as true wireless stereo (TWS) earphones or earbuds, typically include touch detection to detect a user's touch gesture, and in-ear detection to detect whether or not the device is inserted in a user's ear. Touch detection and in-ear detection are particularly useful for audio devices as a user is able to perform several different actions, such as adjusting volume and starting/stopping audio, using touch detection and in-ear detection.

Current electronic devices utilize buttons and various sensors to perform user input detection. For example, touch detection is often performed using buttons or an accelerometer, and in-ear detection is often performed using a proximity sensor. However, such techniques are not ideal for portable audio devices which are constrained in terms of size, processing complexity, power consumption, and cost. For example, pressing a button on the audio device while in the user's ear may be unpleasant for the user, and the buttons themselves occupy valuable space on the audio device. Further, accelerometers generally have high false positive rates (e.g., often falsely detect a touch input) and touch sensors generally have high power consumption and cost. In addition, proximity sensors are often dedicated to in-ear detection, and, thus, consume valuable real estate within the device for a single feature.

BRIEF SUMMARY

The present disclosure is directed to devices and methods that utilize electrostatic charge sensors to perform touch detection, in-ear detection, and swipe detection.

For touch detection, a receiving electrode and a ground electrode are positioned on a surface of a device. The receiving and ground electrodes are electrically isolated from each other, and positioned adjacent to each other such that a user's finger touches the receiving and ground electrodes concurrently. A touch gesture is detected based on electrostatic charge variation on the receiving electrode.

Similarly, for in-ear detection, a receiving electrode and a ground electrode is positioned on a surface of a device. The receiving and ground electrodes are electrically isolated from each other, and positioned adjacent to each other such that a user's ear touches the receiving and ground electrodes concurrently when the device is worn. The device detects whether the device is inserted into the user's ear based on electrostatic charge variation on the receiving electrode.

For swipe detection, a first receiving electrode, a ground electrode, and a second receiving electrode are sequentially positioned on a surface of a device. The first receiving electrode, the ground electrode, and the second receiving electrode are electrically isolated from each other, and adjacent to each other such that a user's finger is able to move across the first receiving electrode, the ground electrode, and the second receiving electrode in a single motion. A swipe gesture is detected based on electrostatic charge variation on the first and second receiving electrodes.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of manufacturing electronic components and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, current electronic devices utilize buttons and various sensors to perform user input detection. However, current techniques are not ideal for portable devices, such as true wireless stereo (TWS) earphones or earbuds, due to their size, processing complexity, power consumption, and cost.

The present disclosure is directed to input detection for electronic devices using electrostatic charge sensors. The devices and methods disclosed herein utilize electrostatic charge sensors to detect various touch gestures, such as long and short touches, single/double/triple taps, and swipes; and perform in-ear detection. The electrostatic charge sensors provide a low false positive rate, low power consumption, and low cost solution for user input detection; and are well suited for portable electronic devices.

Figure 1:
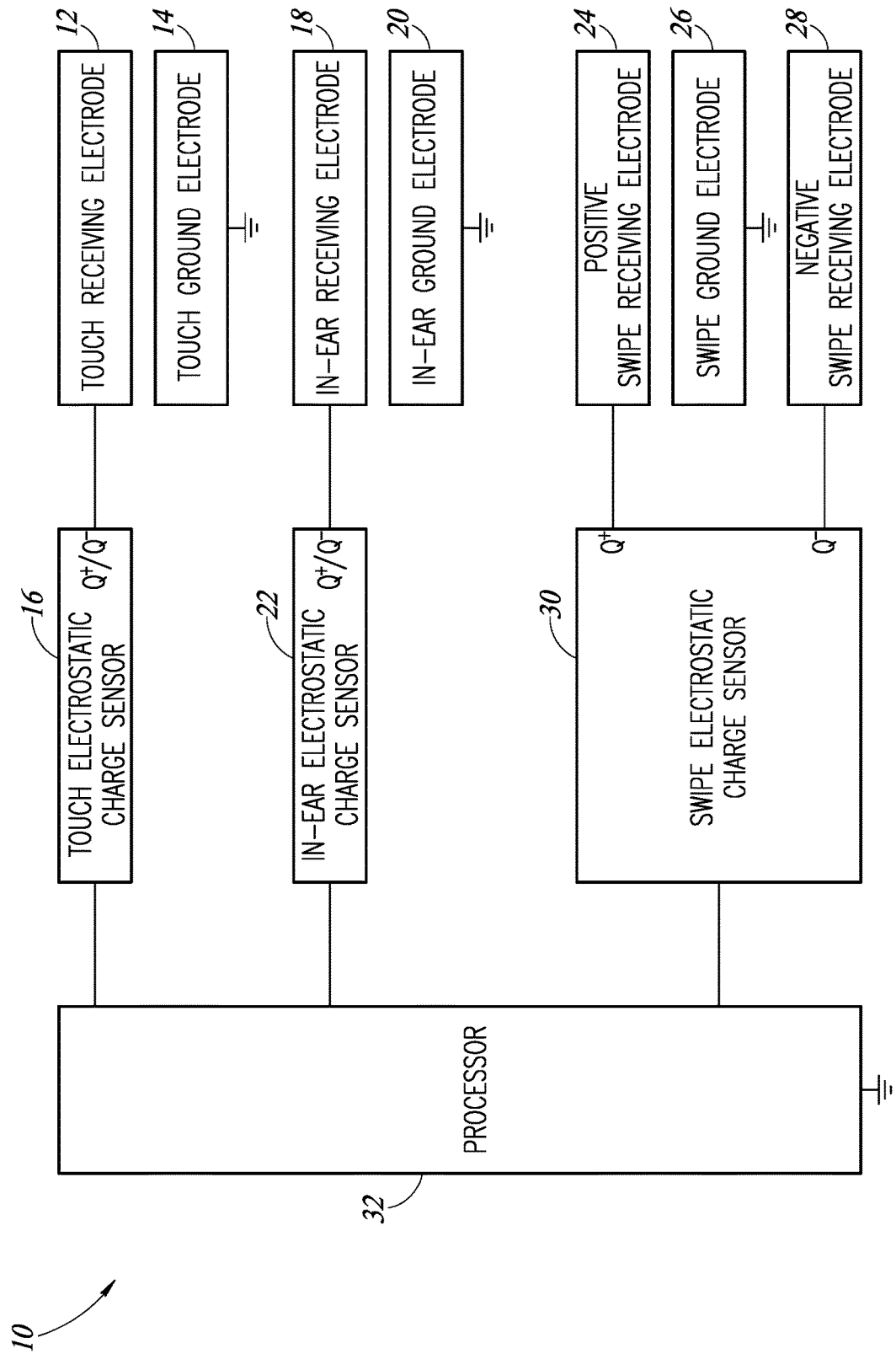
FIG. 1 is a block diagram of a device according to an embodiment disclosed herein.

FIG. 1 is a block diagram of a device 10 according to an embodiment disclosed herein. The device 10 is a portable audio device, such as true wireless stereo (TWS) earphones or earbuds. However, other types of devices are also possible. For example, the device 10 may be any electronic device that utilizes touch or swipe detection, such as laptops, tablets, and wearable devices (e.g., smart watches, health devices, etc.).

The device 10 includes a touch receiving electrode 12, a touch ground electrode 14, a touch electrostatic charge sensor 16, an in-ear receiving electrode 18, an in-ear ground electrode 20, an in-ear electrostatic charge sensor 22, a positive swipe receiving electrode 24, a swipe ground electrode 26, a negative swipe receiving electrode 28, a swipe electrostatic charge sensor 30, and a processor 32. In the case where the device 10 is a portable audio device, the device 10 also includes a speaker that is inserted in to a user's ear and produces sound (e.g., music, a phone call, etc.), and a microphone for receiving sound (e.g., a user's voice).

As will be discussed in further detail below, the touch receiving electrode 12, the touch ground electrode 14, the in-ear receiving electrode 18, the in-ear ground electrode 20, the positive swipe receiving electrode 24, the swipe ground electrode 26, and the negative swipe receiving electrode 28 are positioned on a housing or casing of the device 10. The touch electrostatic charge sensor 16, the in-ear electrostatic charge sensor 22, the swipe electrostatic charge sensor 30, and the processor 32 are positioned within the housing of the device 10, along with any speakers, microphones, electronic components also included in the device 10.

The touch receiving electrode 12, the touch ground electrode 14, and the touch electrostatic charge sensor 16 are utilized to perform touch detection.

The touch receiving electrode 12 is electrically coupled to the touch electrostatic charge sensor 16. In one embodiment, the touch receiving electrode 12 is electrically coupled to a positive terminal $Q^+$ of the touch electrostatic charge sensor 16. In one embodiment, the touch receiving electrode 12 is electrically coupled to a negative terminal $Q^-$ of the touch electrostatic charge sensor 16. The touch receiving electrode 12 is made of a conductive material, such as copper. Various sources, such as a user's finger, generates electrostatic charge variation on the touch receiving electrode 12.

The touch ground electrode 14 is electrically coupled to the device's 10 ground. For example, the touch ground electrode 14 and the processor 32, along with other electrical components of the device 10, share the same ground. The touch ground electrode 14 is made of a conductive material, such as copper. The touch ground electrode 14 induces a large variation of the electrostatic charge signals generated on the touch receiving electrode 12 when the user touches both the touch receiving electrode 12 and the touch ground electrode 14.

The touch receiving electrode 12 and the touch ground electrode 14 are both conductive surfaces that are exposed to a surrounding environment of the device 10, and are electrically isolated from each other. Further, the touch receiving electrode 12 and the touch ground electrode 14 are aligned with each other and positioned immediately adjacent to each other (e.g., within 1 to 3 millimeters of each other) such that a user's finger is able to concurrently touch both the touch receiving electrode 12 and the touch ground electrode 14.

As will be discussed in further detail below, the touch receiving electrode 12 and the touch ground electrode 14 are positioned on an outer surface of the device 10 such that a user is able to physically touch the touch receiving electrode 12 and the touch ground electrode 14 while the device 10 is inserted into the user's ear.

The touch electrostatic charge sensor 16 is electrically coupled to the touch receiving electrode 12 and the processor 32. In one embodiment, the touch electrostatic charge sensor 16 is embedded in a multi-sensor device that includes a plurality of different sensors (e.g., motion sensors, optical sensor, pressure sensors, etc.).

The touch electrostatic charge sensor 16 measures electrostatic charge variation (i.e., a change in electrostatic charge) generated on the touch receiving electrode 12. The touch electrostatic charge sensor 16 provides electrostatic charge variation measurements to the processor 32, which in turn determines various touch gestures based on the electrostatic charge variation measurements.

In a case where the touch receiving electrode 12 is electrically coupled to a positive terminal $Q^+$ of the touch electrostatic charge sensor 16, the touch electrostatic charge sensor 16 measures electrostatic charge variation detected by the touch receiving electrode 12 as a positive value when the user touches both the touch receiving electrode 12 and the touch ground electrode 14. In a case where the touch receiving electrode 12 is electrically coupled to a negative terminal $Q^-$ of the touch electrostatic charge sensor 16, the touch electrostatic charge sensor 16 measures electrostatic charge variation detected by the touch receiving electrode 12 as a negative value when the user touches both the touch receiving electrode 12 and the touch ground electrode 14.

The touch electrostatic charge sensor 16 includes various electronic components (e.g., capacitors, resistors, amplifiers, etc.) to measure electrostatic charge variation. The touch electrostatic charge sensor 16, for example, includes amplifiers to boost a measured electrostatic charge signal, and an analog-to-digital converter to convert a measured electrostatic charge signal to a digital value and output measured electrostatic charge as a digital value.

The in-ear receiving electrode 18, the in-ear ground electrode 20, and the in-ear electrostatic charge sensor 22 are utilized to perform in-ear detection. The in-ear receiving electrode 18, the in-ear ground electrode 20, and the in-ear electrostatic charge sensor 22 are similar to the touch electrostatic charge sensor 16, the touch ground electrode 14, and the touch electrostatic charge sensor 16.

The in-ear receiving electrode 18 is electrically coupled to the in-ear electrostatic charge sensor 22. In one embodiment, the in-ear receiving electrode 18 is electrically coupled to a positive terminal $Q^+$ of the in-ear electrostatic charge sensor 22. In one embodiment, the in-ear receiving electrode 18 is electrically coupled to a negative terminal $Q^-$ of the in-ear electrostatic charge sensor 22. The in-ear receiving electrode 18 is made of a conductive material, such as copper. Various sources, such as a user's ear, generates electrostatic charge variation on the touch receiving electrode 12.

The in-ear ground electrode 20 is electrically coupled to the device's 10 ground. For example, the in-ear ground electrode 20 and the processor 32, along with other electrical components of the device 10, share the same ground. The in-ear ground electrode 20 is made of a conductive material, such as copper. The in-ear ground electrode 20 induces a large variation of the electrostatic charge signals on the in-ear receiving electrode 18 when the user's ear is in contact with both the in-ear receiving electrode 18 and the in-ear ground electrode 20.

The in-ear receiving electrode 18 and the in-ear ground electrode 20 are both conductive surfaces that are exposed to a surrounding environment of the device 10, and are electrically isolated from each other. Further, the in-ear receiving electrode 18 and the in-ear ground electrode 20 are aligned with each other and positioned immediately adjacent to each other (e.g., within 1 to 3 millimeters of each other) such that a user's ear is able to concurrently touch both the in-ear receiving electrode 18 and the in-ear ground electrode 20 when the device 10 is worn by the user (i.e., the device 10 is inserted into the user's ear).

As will be discussed in further detail below, the in-ear receiving electrode 18 and the in-ear ground electrode 20 are positioned on an inner surface of the device 10 such that both the in-ear receiving electrode 18 and the in-ear ground electrode 20 physically and concurrently touch the user's skin when the device 10 is inserted into the user's ear.

The in-ear electrostatic charge sensor 22 is electrically coupled to the in-ear receiving electrode 18 and the processor 32. In one embodiment, the in-ear electrostatic charge sensor 22 is embedded in a multi-sensor device that includes a plurality of different sensors (e.g., motion sensors, optical sensor, pressure sensors, etc.).

The in-ear electrostatic charge sensor 22 measures electrostatic charge variation (i.e., a change in electrostatic charge) generated on the in-ear receiving electrode 18. The in-ear electrostatic charge sensor 22 provides electrostatic charge variation measurements to the processor 32, which in turn determines whether or not the device 10 is in a user's ear based on the electrostatic charge variation measurements.

In a case where the in-ear receiving electrode 18 is electrically coupled to a positive terminal $Q^+$ of the in-ear electrostatic charge sensor 22, the in-ear electrostatic charge sensor 22 measures electrostatic charge variation detected by the in-ear receiving electrode 18 as a positive value when the user's ear is in contact with both the in-ear receiving electrode 18 and the in-ear ground electrode 20. In a case where the in-ear receiving electrode 18 is electrically coupled to a negative terminal $Q^-$ of the in-ear electrostatic charge sensor 22, the in-ear electrostatic charge sensor 22 measures electrostatic charge variation detected by the in-ear receiving electrode 18 as a negative value when the user's ear is in contact with both the in-ear receiving electrode 18 and the in-ear ground electrode 20.

The in-ear electrostatic charge sensor 22 includes various electronic components (e.g., capacitors, resistors, amplifiers, etc.) to measure electrostatic charge variation. The in-ear electrostatic charge sensor 22, for example, includes amplifiers to boost a measured electrostatic charge signal, and an analog-to-digital converter to convert a measured electrostatic charge signal to a digital value and output measured electrostatic charge as a digital value.

The positive swipe receiving electrode 24, the swipe ground electrode 26, the negative swipe receiving electrode 28, and the swipe electrostatic charge sensor 30 are utilized to perform swipe detection.

The positive swipe receiving electrode 24 is electrically coupled to a positive terminal $Q^+$ of the swipe electrostatic charge sensor 30. The positive swipe receiving electrode 24 is made of a conductive material, such as copper. Various sources, such as a user's finger, generates electrostatic charge variation on the positive swipe receiving electrode 24.

The swipe ground electrode 26 is electrically coupled to the device's 10 ground. For example, the swipe ground electrode 26 and the processor 32, along with other electrical components of the device 10, share the same ground. The swipe ground electrode 26 is made of a conductive material, such as copper. The swipe ground electrode 26 induces a large variation of the electrostatic charge signal on the positive swipe receiving electrode 24 when the user touches both the positive swipe receiving electrode 24 and the swipe ground electrode 26, or the negative swipe receiving electrode 28 when the user touches both the negative swipe receiving electrode 28 and the swipe ground electrode 26.

The negative swipe receiving electrode 28 is electrically coupled to a negative terminal $Q^-$ of the swipe electrostatic charge sensor 30. The negative swipe receiving electrode 28 is made of a conductive material, such as copper. Various sources, such as a user's finger, generates electrostatic charge variation on the negative swipe receiving electrode 28.

The positive swipe receiving electrode 24, the swipe ground electrode 26, and the negative swipe receiving electrode 28 are conductive surfaces that are exposed to a surrounding environment of the device 10, and are electrically isolated from each other. The swipe ground electrode 26 is positioned between the positive swipe receiving electrode 24 and the negative swipe receiving electrode 28. Further, the positive swipe receiving electrode 24, the swipe ground electrode 26, and the negative swipe receiving electrode 28 are aligned with each other and positioned immediately adjacent to each other (e.g., within 1 to 3 millimeters of each other) such that a user's finger is able to move across the positive swipe receiving electrode 24, the swipe ground electrode 26, and the negative swipe receiving electrode 28 in a single motion.

As will be discussed in further detail below, the positive swipe receiving electrode 24, the swipe ground electrode 26, and the negative swipe receiving electrode 28 are positioned on an outer surface of the device 10 such that a user is able to physically touch and swipe his or her finger across the positive swipe receiving electrode 24, the swipe ground electrode 26, and the negative swipe receiving electrode 28 while the device 10 is inserted into the user's ear.

The swipe electrostatic charge sensor 30 is electrically coupled to the positive swipe receiving electrode 24, the negative swipe receiving electrode 28, and the processor 32. In one embodiment, the swipe electrostatic charge sensor 30 is embedded in a multi-sensor device that includes a plurality of different sensors (e.g., motion sensors, optical sensor, pressure sensors, etc.).

The swipe electrostatic charge sensor 30 measures electrostatic charge variation (i.e., a change in electrostatic charge) using the electrostatic charge variations generated on the positive swipe receiving electrode 24 and the negative swipe receiving electrode 28. In one embodiment, the swipe electrostatic charge sensor 30 determines an electrostatic charge variation measurement as a differential between the electrostatic charge variation on the positive swipe receiving electrode 24 and the electrostatic charge variation on the negative swipe receiving electrode 28. The swipe electrostatic charge sensor 30 provides electrostatic charge variation measurements to the processor 32, which in turn detects a swipe gesture based on the electrostatic charge variation measurements.

The swipe electrostatic charge sensor 30 includes various electronic components (e.g., capacitors, resistors, amplifiers, etc.) to measure electrostatic charge variation. The swipe electrostatic charge sensor 30, for example, includes amplifiers to boost a measured electrostatic charge signal, and an analog-to-digital converter to convert a measured electrostatic charge signal to a digital value and output measured electrostatic charge as a digital value.

The processor 32 is electrically coupled to and receives electrostatic charge variation measurements from each of the touch electrostatic charge sensor 16, the in-ear electrostatic charge sensor 22, and the swipe electrostatic charge sensor 30. The processor 32 may be any type of processor, controller, or microcontroller that is able to process data. As will be discussed in further detail below, the processor 32 performs touch detection, in-ear detection, and swipe detection based on the electrostatic charge variation measurements received from the touch electrostatic charge sensor 16, the in-ear electrostatic charge sensor 22, and the swipe electrostatic charge sensor 30, respectively.

Figure 2A:
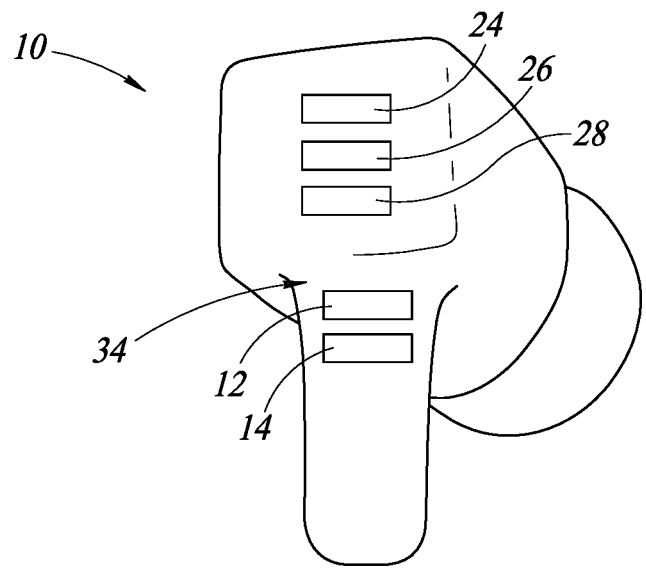
FIG. 2A is an angled view of a first side of a device according to an embodiment disclosed herein.
Figure 2B:
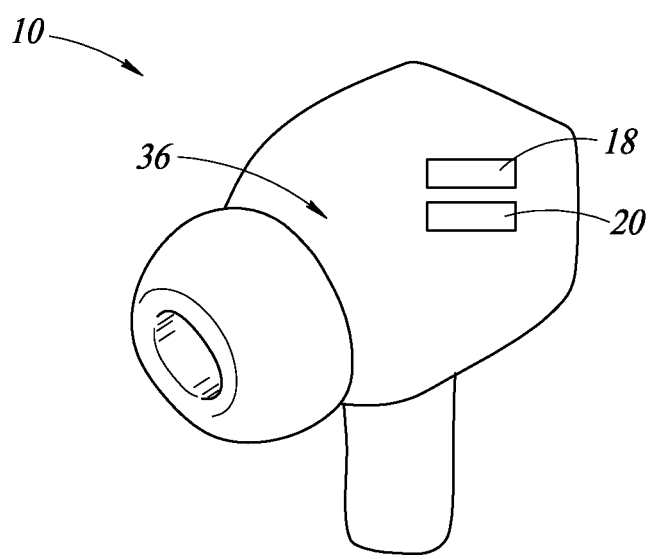
FIG. 2B is an angled view of a second side of a device according to an embodiment disclosed herein.

FIG. 2A is an angled view of a first side of the device 10 according to an embodiment disclosed herein. FIG. 2B is an angled view of a second side, opposite to the first side, of the device 10 according to an embodiment disclosed herein. It is beneficial to review FIGS. 2A and 2B together.

In the embodiment shown in FIGS. 2A and 2B, as discussed above, the device 10 is a portable audio device, such as TWS earphones or earbuds. A single earphone of a pair of earphones that is inserted into a user's ear (e.g., a user's right ear) is shown in FIGS. 2A and 2B. The other earphone of the pair of earphones has a similar configuration except that it is to be inserted into the user's other ear (e.g., a user's left ear).

Referring to FIG. 2A, the touch receiving electrode 12 and the touch ground electrode 14 are positioned on an outer surface or side 34 of the housing of the device 10. The outer surface 34 faces away from a user when the device 10, more specifically the speaker of the device 10, is inserted into the user's ear. As the touch receiving electrode 12 and the touch ground electrode 14 are positioned on the outer surface 34, a user's finger is able to physically touch the touch receiving electrode 12 and the touch ground electrode 14 concurrently while the device 10 is inserted into the user's ear. In one embodiment, the speaker and the outer surface 34 are positioned on opposite sides of the device 10.

As shown in FIG. 2A, the touch receiving electrode 12 and the touch ground electrode 14 are aligned with each other vertically on the outer surface 34. In another embodiment, the touch receiving electrode 12 and the touch ground electrode 14 are aligned with each other horizontally on the outer surface 34.

The positive swipe receiving electrode 24, the swipe ground electrode 26, and the negative swipe receiving electrode 28 are positioned on the outer surface 34 of the device 10 as well. As discussed above, the positive swipe receiving electrode 24, the swipe ground electrode 26, and the negative swipe receiving electrode 28 are aligned with each other; and the swipe ground electrode 26 is positioned between the positive swipe receiving electrode 24 and the negative swipe receiving electrode 28. As the positive swipe receiving electrode 24, the swipe ground electrode 26, and the negative swipe receiving electrode 28 are positioned on the outer surface 34, a user is able to physically touch and swipe his or her finger across the positive swipe receiving electrode 24, the swipe ground electrode 26, and the negative swipe receiving electrode 28 while the device 10 is inserted into the user's ear.

As shown in FIG. 2A, the positive swipe receiving electrode 24, the swipe ground electrode 26, and the negative swipe receiving electrode 28 are aligned with each other vertically on the outer surface 34. With this configuration, as will be discussed in further detail below, the positive swipe receiving electrode 24, the swipe ground electrode 26, and the negative swipe receiving electrode 28 are able to detect a vertical swipe in a downward direction and an upward direction. In another embodiment, the positive swipe receiving electrode 24, the swipe ground electrode 26, and the negative swipe receiving electrode 28 are aligned with each other horizontally on the outer surface 34. With this configuration, as will be discussed in further detail below, the positive swipe receiving electrode 24, the swipe ground electrode 26, and the negative swipe receiving electrode 28 are able to detect a horizontal swipe in a left to right direction and a right to left direction.

Referring to FIG. 2B, the in-ear receiving electrode 18 and the in-ear ground electrode 20 are positioned on an inner surface or side 36 of the housing of the device 10. The inner surface 36 faces towards a user when the device 10, more specifically the speaker of the device 10, is inserted into the user's ear. As the in-ear receiving electrode 18 and the in-ear ground electrode 20 are positioned on the inner surface 36, both the in-ear receiving electrode 18 and the in-ear ground electrode 20 physically and concurrently touch the user's skin when the device 10 is inserted into the user's ear.

As shown in FIG. 2B, the in-ear receiving electrode 18 and the in-ear ground electrode 20 are aligned with each other vertically on the inner surface 36. In another embodiment, the in-ear receiving electrode 18 and the in-ear ground electrode 20 are aligned with each other horizontally on the inner surface 36.

In one embodiment, each of the touch receiving electrode 12, the touch ground electrode 14, the in-ear receiving electrode 18, the in-ear ground electrode 20, the positive swipe receiving electrode 24, the swipe ground electrode 26, and the negative swipe receiving electrode 28 is square or rectangular in shape.

Figure 3:
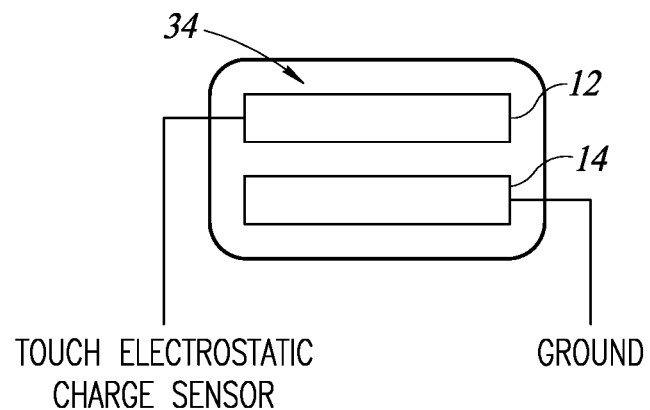
FIG. 3 is an enlarged view of a touch receiving electrode and a touch ground electrode according to an embodiment disclosed herein.

FIG. 3 is an enlarged view of the touch receiving electrode 12 and the touch ground electrode 14 according to an embodiment disclosed herein. As shown in FIG. 3, each of the touch receiving electrode 12 and the touch ground electrode 14 has a rectangular shape. As discussed above, the touch receiving electrode 12 and the touch ground electrode 14 are aligned with each other and positioned on the outer surface 34.

Figure 4:
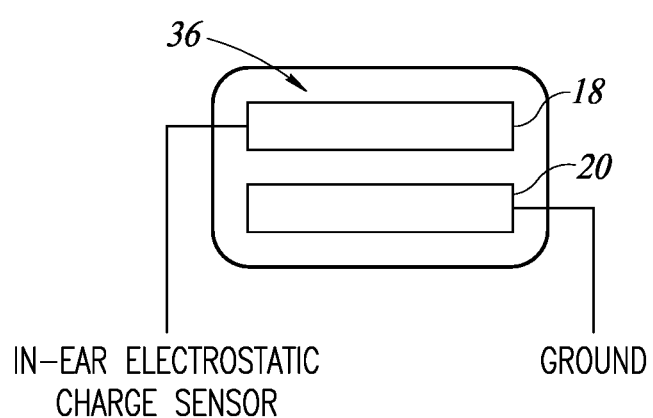
FIG. 4 is an enlarged view of an in-ear receiving electrode and an in-ear ground electrode according to an embodiment disclosed herein.

FIG. 4 is an enlarged view of the in-ear receiving electrode 18 and the in-ear ground electrode 20 according to an embodiment disclosed herein. As shown in FIG. 4, each of the in-ear receiving electrode 18 and the in-ear ground electrode 20 has a rectangular shape. As discussed above, the in-ear receiving electrode 18 and the in-ear ground electrode 20 are aligned with each other and positioned on the inner surface 36.

Figure 5:
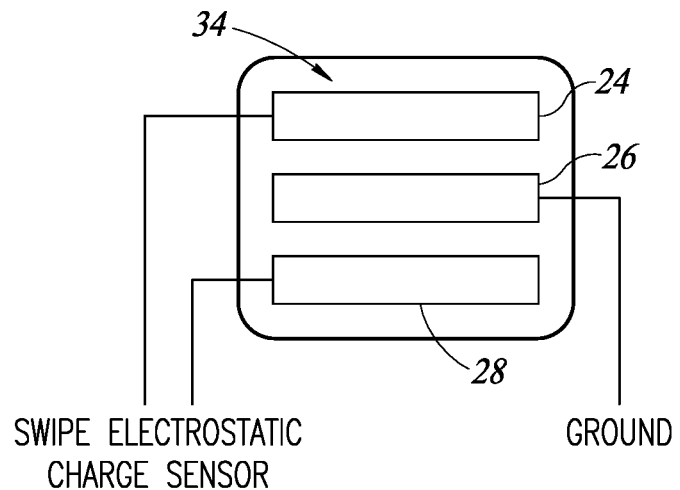
FIG. 5 is an enlarged view of a positive swipe receiving electrode, a swipe ground electrode, and a negative swipe receiving electrode according to an embodiment disclosed herein.

FIG. 5 is an enlarged view of the positive swipe receiving electrode 24, the swipe ground electrode 26, and the negative swipe receiving electrode 28 according to an embodiment disclosed herein. As shown in FIG. 5, each of the positive swipe receiving electrode 24, the swipe ground electrode 26, and the negative swipe receiving electrode 28 has a rectangular shape. As discussed above, the positive swipe receiving electrode 24, the swipe ground electrode 26, and the negative swipe receiving electrode 28 are aligned with each other and positioned on the outer surface 34. Further, the swipe ground electrode 26 is positioned between the positive swipe receiving electrode 24 and the negative swipe receiving electrode 28.

Figure 6:
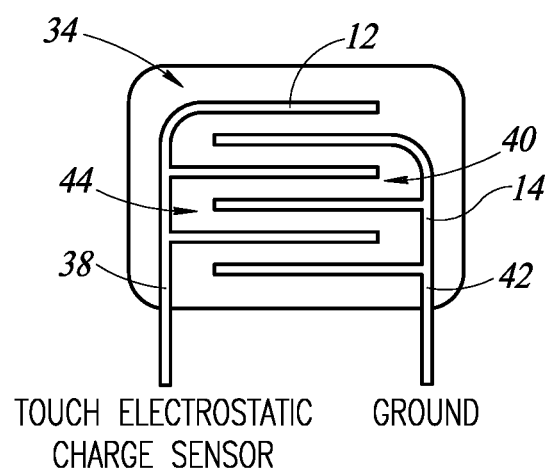
FIG. 6 is an enlarged view of a touch receiving electrode and a touch ground electrode according to an embodiment disclosed herein.

Electrodes with other shapes is also possible. FIG. 6 is an enlarged view of the touch receiving electrode 12 and the touch ground electrode 14 according to an embodiment disclosed herein.

As shown in FIG. 6, each of the touch receiving electrode 12 and the touch ground electrode 14 is comb-shaped. The touch receiving electrode 12 includes a main extension 38 electrically coupled to the touch electrostatic charge sensor 16, and a plurality of extensions or fingers electrically coupled to the main extension 38. The main extension 38 extends in a first direction (e.g., vertically in FIG. 6), and the plurality of extensions 40 extends in a second direction transverse to the first direction (e.g., horizontally in FIG. 6). Similarly, the touch ground electrode 14 includes a main extension 42 electrically coupled to ground, and a plurality of extensions or fingers electrically coupled to the main extension 42. The main extension 42 extends in the first direction, and the plurality of extensions 44 extends in the second direction. The plurality of extensions 40 and the plurality of extensions 44 are aligned with each other in the first direction. Further, one or more of the plurality of extensions 40 are positioned between two of the plurality of extensions 44. Stated differently, one of the plurality of extensions 44 is spaced from another one of the plurality of extensions 44 by one of the plurality of extensions 40.

The same electrode shapes shown in FIG. 6 may also be used for the in-ear receiving electrode 18 and the in-ear ground electrode 20.

The same electrode shapes shown in FIG. 6 may also be used for the positive swipe receiving electrode 24 and the swipe ground electrode 26, and for the negative swipe receiving electrode 28 and the swipe ground electrode 26.

As discussed above, the touch receiving electrode 12, the touch ground electrode 14, and the touch electrostatic charge sensor 16 are utilized to perform touch detection. The touch receiving electrode 12 and the touch ground electrode 14 are positioned adjacent to each other such that a user's finger is able to concurrently touch both the touch receiving electrode 12 and the touch ground electrode 14.

In response to a user concurrently touching the touch receiving electrode 12 and the touch ground electrode 14, the touch electrostatic charge sensor 16 measures a large electrostatic charge variation (e.g., a non-zero voltage level). Conversely, when a user is not touching the touch receiving electrode 12 and the touch ground electrode 14, the touch electrostatic charge sensor 16 measures a small electrostatic charge variation (e.g., a near zero voltage level). Accordingly, touch may be detected based on electrostatic charge variation measured by the touch electrostatic charge sensor 16.

Figure 7:
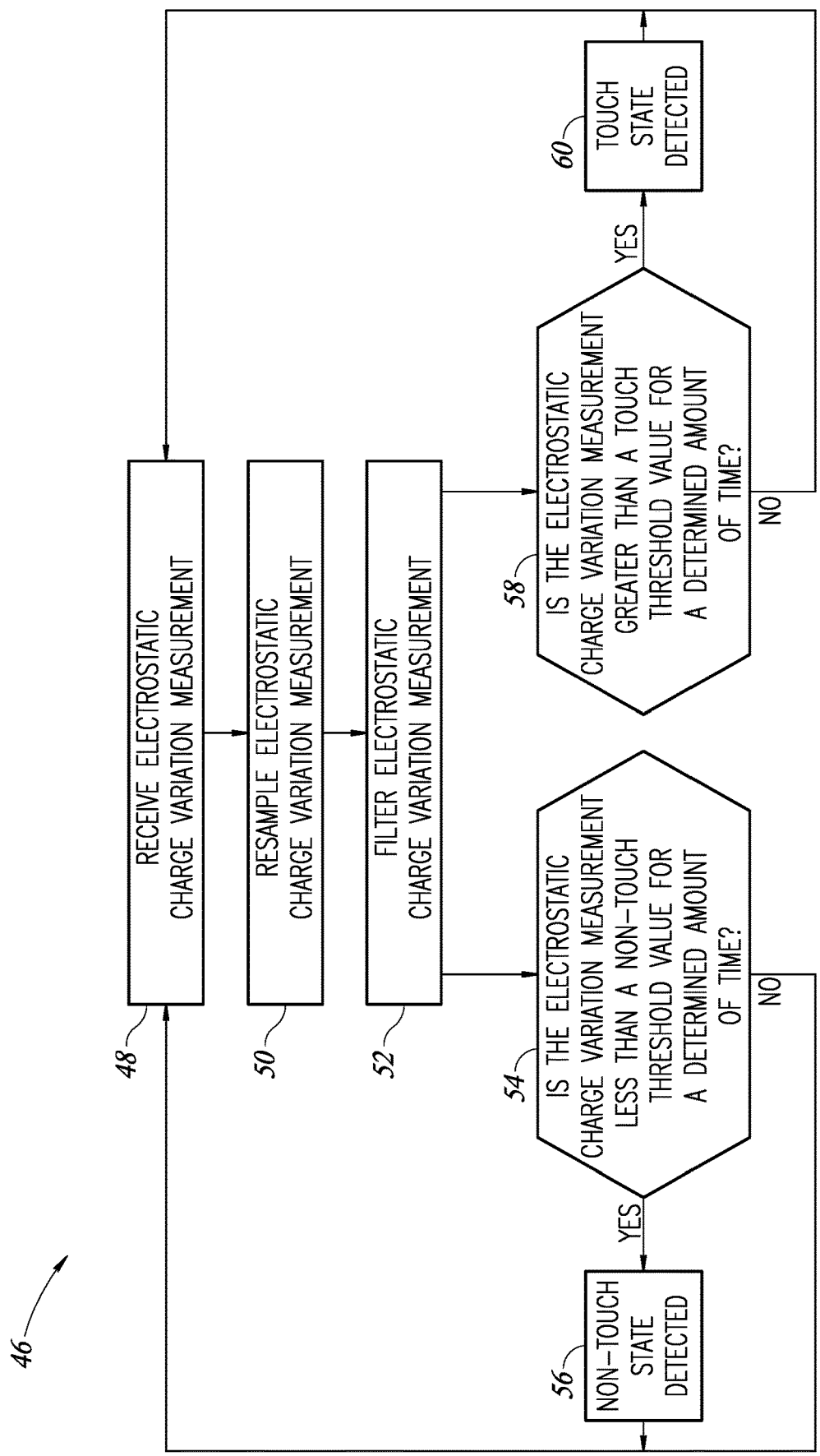
FIG. 7 is a flow diagram of a method for performing touch detection according to an embodiment disclosed herein.

FIG. 7 is a flow diagram of a method 46 for performing touch detection according to an embodiment disclosed herein. In the method 46, the touch receiving electrode 12 is electrically coupled to a positive terminal $Q^+$ of the touch electrostatic charge sensor 16, and, thus, the touch electrostatic charge sensor 16 measures electrostatic charge variation detected by the touch receiving electrode 12 as a positive value when the user touches both the touch receiving electrode 12 and the touch ground electrode 14.

In block 48, the processor 32 receives an electrostatic charge variation measurement from the touch electrostatic charge sensor 16. As discussed above, the touch electrostatic charge sensor 16 measures electrostatic charge variation induced upon the touch receiving electrode 12. In one embodiment, the electrostatic charge variation measurement is electrostatic charge variation sampled at a fixed rate by the touch electrostatic charge sensor 16. The method 46 then moves to block 50.

In block 50, the processor 32 resamples the electrostatic charge variation measurement received in block 48 to a desired data rate for processing. For example, in one embodiment, the processor 32 includes a decimator to reduce or down sample the electrostatic charge variation measurement (e.g., down sample the electrostatic charge variation measurement from 480 hertz to 240 hertz). Conversely, the processor 32 includes an interpolator to up sample the electrostatic charge variation measurement. In some embodiments, block 50 is omitted. The method 46 then moves to block 52.

In block 52, the processor 32 filters the electrostatic charge variation measurement to remove certain frequencies from the electrostatic charge variation measurement (e.g., noise, electrostatic charge variation caused by unwanted sources, such as an AC power line, etc.). The processor 32 may apply a low pass filter, a high pass filter, a band pass filter, or a combination thereof to the electrostatic charge variation measurement. In one embodiment, for example, the processor 32 applies a band pass filter to remove frequencies less than 4 hertz and greater than 15 hertz. In some embodiments, block 52 is omitted. The method 46 then moves to block 54 and block 58.

In block 54, the processor 32 determines whether the resampled and filtered electrostatic charge variation measurement is less than a non-touch threshold value for a determined amount of time. The non-touch threshold value is a configurable value (e.g., voltage level value) that is used to determine whether the device 10 is in a non-touch state. In the non-touch state, a user is not touching the touch receiving electrode 12 or the touch ground electrode 14. The determined amount of time may be, for example, a time value (e.g., 0.1 seconds), a number of consecutive samples by the touch electrostatic charge sensor 16, or a number of consecutive electrostatic charge variation measurements received in block 48.

In a case where the processor 32 determines the electrostatic charge variation measurement is less than the non-touch threshold value for the determined amount of time, the method 46 moves to block 56. In block 56, the processor 32 determines the device 10 is in the non-touch state, and outputs a non-touch event indicating the non-touch state for further processing. For example, the device 10 may be set to maintain its current state (e.g., continue to play audio) upon determining the non-touch state. The method 46 subsequently returns to block 48, where the processor 32 continues to receive electrostatic charge variation measurements from the touch electrostatic charge sensor 16. In a case where the processor 32 determines the electrostatic charge variation measurement is not less than the non-touch threshold value for the determined amount of time, the method 46 returns to block 48, where the processor 32 continues to receive electrostatic charge variation measurements from the touch electrostatic charge sensor 16.

Blocks 58 and 60 may be performed concurrently with blocks 54 and 56.

In block 58, the processor 32 determines whether the resampled and filtered electrostatic charge variation measurement is greater than a touch threshold value for a determined amount of time. The touch threshold value is a configurable value (e.g., voltage level value) that is used to determine whether the device 10 is in a touch state. In the touch state, a user is touching both the touch receiving electrode 12 and the touch ground electrode 14. In one embodiment, the touch threshold value is greater than the non-touch threshold value. In one embodiment, the touch threshold value is equal to the non-touch threshold value. The determined amount of time may be, for example, a time value (e.g., 0.1 seconds), a number of consecutive samples by the touch electrostatic charge sensor 16, or a number of consecutive electrostatic charge variation measurements received in block 48.

In a case where the processor 32 determines the electrostatic charge variation measurement is greater than the touch threshold value for the determined amount of time, the method 46 moves to block 60. In block 60, the processor 32 determines the device 10 is in the touch state, and outputs a touch event indicating the touch state for further processing. For example, the device 10 may perform an action (e.g., adjust volume, skip currently playing audio, fast forward or rewind audio, play or stop audio, etc.) upon determining the touch state. The method 46 subsequently returns to block 48, where the processor 32 continues to receive electrostatic charge variation measurements from the touch electrostatic charge sensor 16.

In a case where the processor 32 determines the electrostatic charge variation measurement is not greater than the touch threshold value for the determined amount of time, the method 46 returns to block 48, where the processor 32 continues to receive electrostatic charge variation measurements from the touch electrostatic charge sensor 16.

As mentioned above, in the method 46, the touch receiving electrode 12 is electrically coupled to a positive terminal $Q^+$ of the touch electrostatic charge sensor 16, and, thus, the touch electrostatic charge sensor 16 measures electrostatic charge variation received by the touch receiving electrode 12 as a positive value when the user touches both the touch receiving electrode 12 and the touch ground electrode 14. The touch receiving electrode 12 may also be electrically coupled to a negative terminal $Q^-$ of the touch electrostatic charge sensor 16, in which case the touch electrostatic charge sensor 16 measures electrostatic charge variation received by the touch receiving electrode 12 as a negative value when the user touches both the touch receiving electrode 12 and the touch ground electrode 14. In this embodiment, in block 54, the processor 32 determines whether an absolute value of the electrostatic charge variation measurement is less than the non-touch threshold value; the method 46 moves to block 56 in case the absolute value of the electrostatic charge variation measurement is less than the non-touch threshold value; and the method 46 moves to block 48 in case the absolute value of the electrostatic charge variation measurement is not less than the non-touch threshold value. Further, in block 58, the processor 32 determines whether an absolute value of the electrostatic charge variation measurement is greater than the touch threshold value; the method 46 moves to block 60 in case the absolute value of the electrostatic charge variation measurement is greater than the touch threshold value; and the method 46 moves to block 48 in case the absolute value of the electrostatic charge variation measurement is not greater than the touch threshold value.

Alternatively, in block 54, the processor 32 determines whether the electrostatic charge variation measurement is greater than the non-touch threshold value; the method 46 moves to block 56 in case the electrostatic charge variation measurement is greater than the non-touch threshold value; and the method 46 moves to block 48 in case the electrostatic charge variation measurement is not greater than the non-touch threshold value. Further, in block 58, the processor 32 determines whether the electrostatic charge variation measurement is less than the touch threshold value; the method 46 moves to block 60 in case the electrostatic charge variation measurement is less than the touch threshold value; and the method 46 moves to block 48 in case the electrostatic charge variation measurement is not less than the touch threshold value.

A timer is used to track a duration of a touch state, and classify a touch state as a long touch or a short touch. A long touch is detected in response to the touch state being continuously detected for an extended period of time (e.g., for 0.6 seconds or longer). Stated differently, a long touch is detected in response to a user touching both the touch receiving electrode 12 and the touch ground electrode 14 for an extended period of time. Conversely, a short touch is detected in response to the touch state being continuously detected for a brief period of time (e.g., for 0.4 seconds or less). Stated differently, a short touch is detected in response to a user touching both the touch receiving electrode 12 and the touch ground electrode 14 for a brief period of time.

Figure 8:
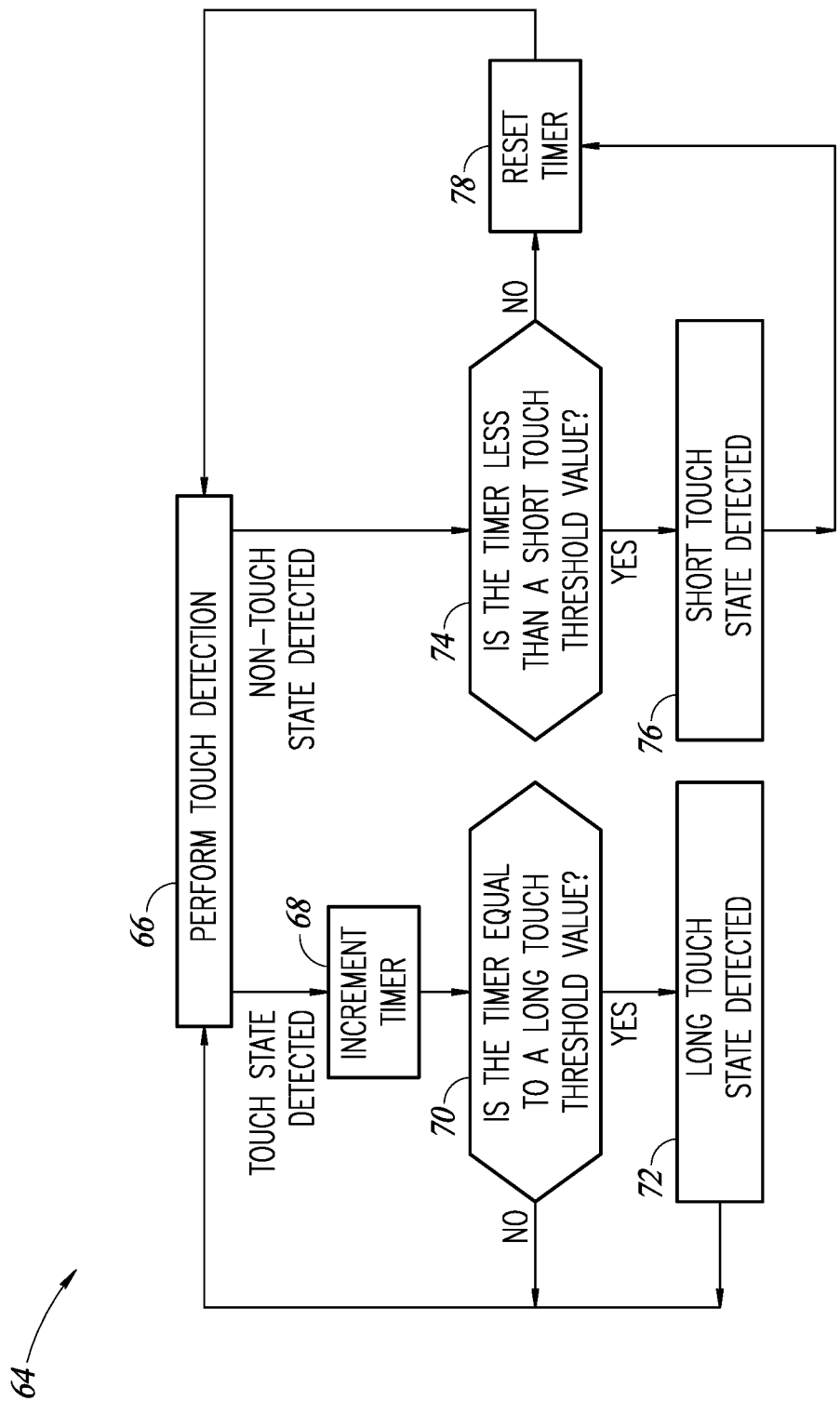
FIG. 8 is a flow diagram of a method for classifying a touch as a long touch or a short touch according to an embodiment disclosed herein.

FIG. 8 is a flow diagram of a method 64 for classifying a touch as a long touch or a short touch according to an embodiment disclosed herein.

In block 66, touch detection is performed to detect a touch state or a non-touch state. For example, the method 46 discussed with respect to FIG. 7 is executed.

In a case where the touch state is detected in block 66 (e.g., block 60 is reached in the method 46 of FIG. 7), the method 64 moves to block 68. In block 68, a timer is incremented by, for example, 1. The timer is a counter used to track a duration of the touch state. The timer is initialized at zero (i.e., the timer is zero when the method 64 is started at block 66). The method 64 then moves to block 70.

In block 70, the processor 32 determines whether the timer is equal to a long touch threshold value. The long touch threshold value is a configurable value (e.g., a time value) that is used to determine whether the device 10 is in a long touch state. In the long touch state, a user is touching both the touch receiving electrode 12 and the touch ground electrode 14 for an extended period of time (e.g., for 0.6 seconds or longer).

In a case where the timer is not equal to the long touch threshold value, the method 64 returns to block 66, where touch detection is continued to be performed.

In a case where the timer is equal to the long touch threshold value, the method 64 moves to block 72. In block 72, the processor 32 determines the device 10 is in the long touch state, and outputs a long touch event indicating the long touch state for further processing. For example, the device 10 may perform an action (e.g., adjust volume, skip currently playing audio, fast forward or rewind audio, play or stop audio, etc.) upon determining the long touch event. The method 64 then returns to block 66, where the touch detection is continued to be performed.

Returning to block 66, in a case where the non-touch state is detected in block 66 (e.g., block 56 is reached in the method 46 of FIG. 7), the method 64 moves to block 74. In block 74, the processor 32 determines whether the timer is less than a short touch threshold value. The short touch threshold value is a configurable value (e.g., a time value) that is used to determine whether the device 10 is in a short touch state. In one embodiment, the short touch state value is smaller than the long touch threshold value. In the short touch state, a user is touching both the touch receiving electrode 12 and the touch ground electrode 14 for a brief period of time (e.g., for 0.4 seconds or less).

In a case where the timer is not less than the short touch threshold value, the method 64 moves to block 78. In block 78, the timer is reset to zero in order for the timer to be used again to track a duration of a touch state. The method 64 then returns to block 66, where touch detection is continued to be performed.

In a case where the timer is less than the short touch threshold value, the method 64 moves to block 76. In block 76, the processor 32 determines the device 10 is in the short touch state, and outputs a short touch event indicating the short touch state for further processing. For example, the device 10 may perform an action (e.g., adjust volume, skip currently playing audio, fast forward or rewind audio, play or stop audio, etc.) upon determining the short touch event. The method 64 then moves to block 78.

As discussed above, in block 78, the timer is reset to zero in order for the timer to be used again to track a duration of a touch state. The method 64 then returns to block 66, where touch detection is continued to be performed.

A timer is also used to classify a short touch as one or more taps. A single tap is detected in response to a single short touch event being detected, a double tap is detected in response to two successive short touch events being detected within a threshold time of each other, a triple tap is detected in response to three successive short touch events being detected within a threshold time of each other, and so on. Any number of taps may be detected.

Figure 9:
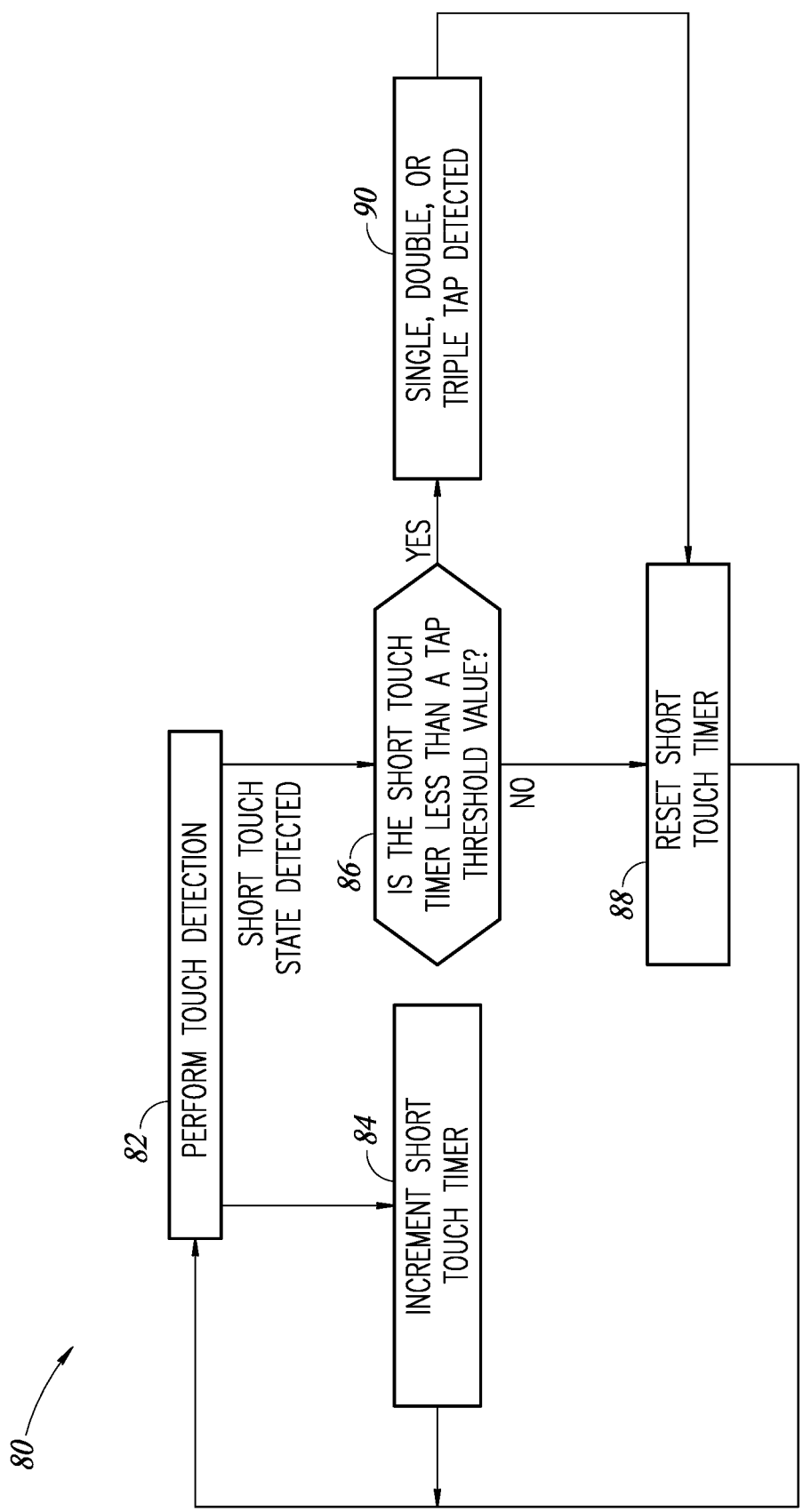
FIG. 9 is a flow diagram of a method for performing tap detection according to an embodiment disclosed herein.

FIG. 9 is a flow diagram of a method 80 for performing tap detection according to an embodiment disclosed herein.

In block 82, touch detection is performed. For example, the method 46 discussed with respect to FIG. 7 and the method 64 discussed with respect to FIG. 8 are executed. The method 80 then moves to block 84.

In block 84, a short touch timer is incremented by, for example, 1. The short touch timer is a counter used to track latency between successive short touch events. Stated differently, the short touch timer tracks time between repeated short touch events. The short touch timer is initialized at zero (i.e., the timer is zero when the method 80 is started at block 82). The method 80 then returns to block 82, where touch detection is continued to be performed.

In a case where the short touch event is detected in block 82 (e.g., block 76 is reached in the method 64 of FIG. 8), the method 80 moves to block 86.

Blocks 86, 88, and 90 may be performed concurrently with block 84. In block 86, the processor 32 determines whether the short touch timer is less than a tap threshold value. The tap threshold value is a configurable value (e.g., a time value) that is used to detect one or more taps.

In a case where the short touch timer is not less than the tap threshold value, the method 80 moves to block 88. In block 88, the timer is reset to zero in order for the timer to be used again to track latency between successive short touch events. The method 80 then returns to block 82, where touch detection is continued to be performed.

In a case where the short touch timer is less than the short touch threshold value, the method 80 moves to block 90. In block 90, the processor 32 classifies the short touch event detected in block 82 as a single tap, a double tap, triple tap, etc. The short touch event is classified as a single tap, a double tap, triple tap, etc., depending on whether a tap was previously detected. For example, the processor 32 classifies the short touch event as a single tap if another type of touch (e.g., a long touch event) was detected immediately prior to the short touch event detected in block 82, or if the short touch state detected in block 82 is the first short touch event detected within a determined period of time; a double tap if a single tap was detected immediately prior to the short touch event detected in block 82; and a triple tap if a double tap was detected immediately prior to the short touch event detected in block 82. Any number of taps may be detected. The method 80 then moves to block 88.

As discussed above, in block 88, the timer is reset to zero in order for the timer to be used again to track latency between successive short touch events. The method 80 then returns to block 82, where touch detection is continued to be performed.

One or more of the touch events discussed above may be validated by other touch detection techniques. In one embodiment, for example, the device 10 utilizes an accelerometer to detect a short touch event. In this embodiment, the device 10 validates a detected short touch event in the method 64 discussed with respect to FIG. 8 in response to also determining a short touch event based on acceleration measurements within a determined amount of time.

As discussed above, the in-ear receiving electrode 18, the in-ear ground electrode 20, and the in-ear electrostatic charge sensor 22 are utilized to perform in-ear detection. The in-ear receiving electrode 18 and the in-ear ground electrode 20 are positioned immediately adjacent to each other such that a user's ear concurrently touches both the in-ear receiving electrode 18 and the in-ear ground electrode 20 when the device 10 is worn by the user.

When the device 10 is inserted into a user's ear (i.e., the user's ear is concurrently touching the in-ear receiving electrode 18 and the in-ear ground electrode 20), the in-ear electrostatic charge sensor 22 measures a large electrostatic charge variation signal. For example, the in-ear electrostatic charge sensor 22 measures a large (e.g., a non-zero voltage level) electrostatic charge variation signal. Conversely, when the device 10 is not inserted into a user's ear (i.e., the user's ear is not touching the in-ear receiving electrode 18 and the in-ear ground electrode 20), the in-ear electrostatic charge sensor 22 measures a small electrostatic charge variation signal. For example, in-ear electrostatic charge sensor 22 measures an electrostatic charge variation signal that fluctuates at a near zero level (e.g., at a near zero voltage level). Accordingly, it may be determined whether or not the device 10 is currently in a user's ear based on electrostatic charge variation measured by the in-ear electrostatic charge sensor 22.

Figure 10:
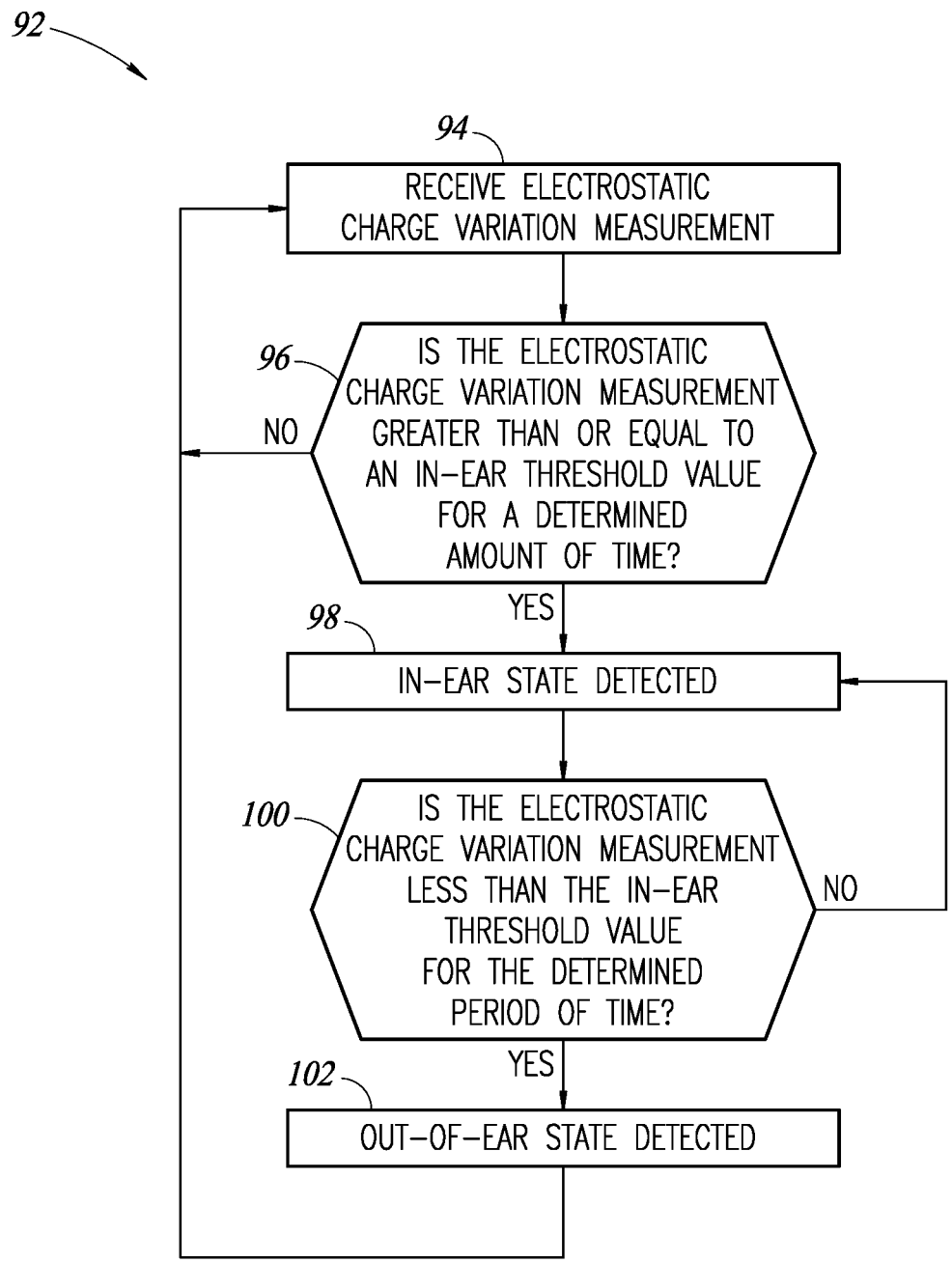
FIG. 10 is a flow diagram of a method for performing in-ear detection according to an embodiment disclosed herein.

FIG. 10 is a flow diagram of a method 92 for performing in-ear detection according to an embodiment disclosed herein. In the method 92, the in-ear receiving electrode 18 is electrically coupled to a positive terminal $Q^+$ of the in-ear electrostatic charge sensor 22, and, thus, the in-ear electrostatic charge sensor 22 measures electrostatic charge variation induced upon the in-ear receiving electrode 18 as a positive value when the user's ear is in contact with both the in-ear receiving electrode 18 and the in-ear ground electrode 20.

In block 94, the processor 32 receives an electrostatic charge variation measurement from the in-ear electrostatic charge sensor 22. As discussed above, the in-ear electrostatic charge sensor 22 measures electrostatic charge variation induced upon the in-ear receiving electrode 18. In one embodiment, the electrostatic charge variation measurement is electrostatic charge variation sampled at a fixed rate by the in-ear electrostatic charge sensor 22. The method 92 then moves to block 96.

In block 96, the processor 32 determines whether the electrostatic charge variation measurement is large by determining whether the electrostatic charge variation measurement is greater than or equal to an in-ear touch threshold value for a determined amount of time. The in-ear threshold value is a configurable value (e.g., voltage level value) that is used to determine whether the device 10 is in an in-ear state or an out-of-ear state. In the in-ear state, the device 10 is inserted into a user's ear, and the user's ear is concurrently touching the in-ear receiving electrode 18 and the in-ear ground electrode 20. In the out-of-ear state, the device 10 is not inserted into a user's ear, and the user's ear is not concurrently touching the in-ear receiving electrode 18 or the in-ear ground electrode 20. The determined amount of time may be, for example, a time value (e.g., 0.5 seconds), a number of consecutive samples by the in-ear electrostatic charge sensor 22, or a number of consecutive electrostatic charge variation measurements received in block 94.

In a case where the processor 32 determines the electrostatic charge variation measurement is not greater than or equal to the in-ear touch threshold value for the determined amount of time, the method 92 returns to block 94, where the processor 32 continues to receive electrostatic charge variation measurements from the in-ear electrostatic charge sensor 22.

In a case where the processor 32 determines the electrostatic charge variation measurement is greater than or equal to the in-ear touch threshold value for the determined amount of time, the method 92 moves to block 98. In block 98, the processor 32 determines the device 10 is in the in-ear state, and outputs an in-ear even indicating the in-ear state for further processing. For example, the device 10 may perform an action (e.g., change a power state of the device 10, play or stop audio, etc.) upon determining the in-ear state. The method 92 then moves to block 100.

In block 100, the processor 32 continues to receive electrostatic charge variation measurements from the in-ear electrostatic charge sensor 22, and determines whether the electrostatic charge variation measurement is small by determining whether the electrostatic charge variation measurement is less than the in-ear touch threshold value for the determined amount of time. In another embodiment, an in-ear touch threshold value and a determined amount of time, which are different from the in-ear touch threshold value and the determined amount of time used in block 94, are used in block 100.

In a case where the processor 32 determines the electrostatic charge variation measurement is not less than the in-ear touch threshold value for the determined amount of time, the method 92 returns to block 98, where the device 10 remains in the in-ear state.

In a case where the processor 32 determines the electrostatic charge variation measurement is less than the in-ear touch threshold value for the determined amount of time, the method 92 moves to block 102. In block 102, the processor 32 determines the device 10 is in the out-of-ear state, and outputs an out-of-ear event indicating the out-of-ear state for further processing. For example, the device 10 may perform an action (e.g., change a power state of the device 10, play or stop audio, etc.) upon determining the out-of-ear state. The method 92 then returns to block 94, where the processor 32 continues to receive electrostatic charge variation measurements from the in-ear electrostatic charge sensor 22.

As mentioned above, in the method 92, the in-ear receiving electrode 18 is electrically coupled to a positive terminal $Q^+$ of the in-ear electrostatic charge sensor 22, and, thus, the in-ear electrostatic charge sensor 22 measures electrostatic charge variation induced upon the in-ear receiving electrode 18 as a positive value when the user's ear is in contact with both the in-ear receiving electrode 18 and the in-ear ground electrode 20. The in-ear receiving electrode 18 may also be electrically coupled to a negative terminal $Q^-$ of the touch electrostatic charge sensor 16, in which case the in-ear receiving electrode 18 measures electrostatic charge variation induced upon the touch receiving electrode 12 as a negative value when the user's ear is in contact with both the in-ear receiving electrode 18 and the in-ear ground electrode 20. In this embodiment, in block 96, the processor 32 determines whether an absolute value of the electrostatic charge variation measurement is greater than or equal to the in-ear touch threshold value for the determined amount of time; the method 92 moves to block 94 in case the absolute value of the electrostatic charge variation measurement is not greater than or equal to the in-ear touch threshold value for the determined amount of time; and the method 92 moves to block 98 in case the absolute value of the electrostatic charge variation measurement is greater than or equal to the in-ear touch threshold value for the determined amount of time. Further, in block 100, the processor 32 determines whether an absolute value of the electrostatic charge variation measurement is less than the in-ear touch threshold value for the determined amount of time; the method 92 moves to block 98 in case the absolute value of the electrostatic charge variation measurement is not less than the in-ear touch threshold value for the determined amount of time; and the method 92 moves to block 102 in case the absolute value of the electrostatic charge variation measurement is less than the in-ear touch threshold value for the determined amount of time.

Alternatively, in block 96, the processor 32 determines whether the electrostatic charge variation measurement is less than or equal to the in-ear touch threshold value for the determined amount of time; the method 92 moves to block 94 in case the electrostatic charge variation measurement is not less than or equal to the in-ear touch threshold value for the determined amount of time; and the method 92 moves to block 98 in case the electrostatic charge variation measurement is less than or equal to the in-ear touch threshold value for the determined amount of time. Further, in block 100, the processor 32 determines whether the electrostatic charge variation measurement is greater than the in-ear touch threshold value for the determined amount of time; the method 92 moves to block 98 in case the electrostatic charge variation measurement is not greater than the in-ear touch threshold value for the determined amount of time; and the method 92 moves to block 102 in case the electrostatic charge variation measurement is greater than the in-ear touch threshold value for the determined amount of time.

Although not included in the method 92, electrostatic charge variation measurements may also be resampled and filtered as discussed above with respect to the method 46 in FIG. 7. For example, blocks 50 and 52 of the method 46 may be inserted between blocks 94 and 96 of the method 92.

As discussed above, the positive swipe receiving electrode 24, the swipe ground electrode 26, the negative swipe receiving electrode 28, and the swipe electrostatic charge sensor 30 are utilized to perform swipe detection. The swipe ground electrode 26 is positioned between the positive swipe receiving electrode 24 and the negative swipe receiving electrode 28. Further, the positive swipe receiving electrode 24, the swipe ground electrode 26, and the negative swipe receiving electrode 28 are positioned immediately adjacent to each other such that a user's finger is able to move across the positive swipe receiving electrode 24, the swipe ground electrode 26, and the negative swipe receiving electrode 28 in a single motion.

In response to a user's finger sequentially moving across the positive swipe receiving electrode 24, the swipe ground electrode 26, the negative swipe receiving electrode 28, the swipe electrostatic charge sensor 30 measures an electrostatic charge variation signal that transitions from a large, positive value to a large, negative value. Conversely, in response to a user's finger sequentially moving across the negative swipe receiving electrode 28, the swipe ground electrode 26, and the positive swipe receiving electrode 24, the swipe electrostatic charge sensor 30 measures an electrostatic charge variation signal that transitions from a large, negative value to a large, positive value. Accordingly, a swipe gesture and a direction of the swipe gesture may be detected based on electrostatic charge variation measured by the swipe electrostatic charge sensor 30.

Figure 11:
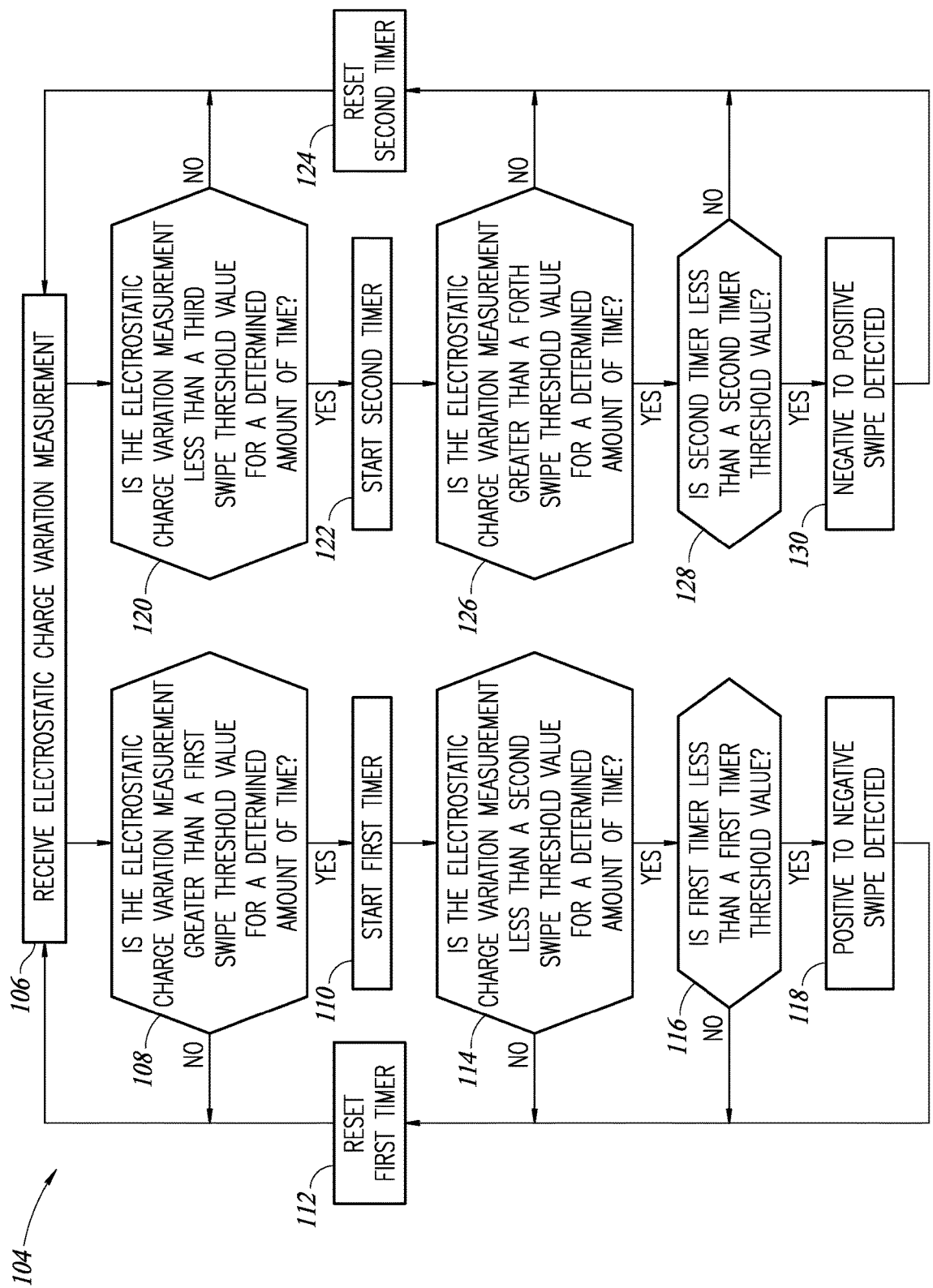
FIG. 11 is a flow diagram of a method for performing swipe detection according to an embodiment disclosed herein.

FIG. 11 is a flow diagram of a method 104 for performing swipe detection according to an embodiment disclosed herein.

In block 106, the processor 32 receives an electrostatic charge variation measurement from the swipe electrostatic charge sensor 30. As discussed above, the swipe electrostatic charge sensor 30 measures electrostatic charge variation induced upon the positive swipe receiving electrode 24 and the negative swipe receiving electrode 28. In one embodiment, the electrostatic charge variation measurement is electrostatic charge variation sampled at a fixed rate by the swipe electrostatic charge sensor 30. The method 104 then moves to blocks 108 and 120.

Blocks 108, 110, 112, 114, 116, and 118 are performed to detect a positive to negative swipe. Blocks 120, 122, 124, 126, 128, and 130 are performed to detect a negative to positive swipe. Blocks 108, 110, 112, 114, 116, and 118 may be performed concurrently with blocks 120, 122, 124, 126, 128, and 130.

In block 108, the processor 32 determines whether the electrostatic charge variation measurement is greater than a first swipe threshold value for a determined amount of time. The first swipe threshold value is a configurable value (e.g., voltage level value) that is used to determine whether a user's finger is touching the positive swipe receiving electrode 24. The determined amount of time may be, for example, a time value (e.g., 0.1 seconds), a number of consecutive samples by the swipe electrostatic charge sensor 30, or a number of consecutive electrostatic charge variation measurements received in block 106.

In a case where the processor 32 determines the electrostatic charge variation measurement is not greater than the first swipe threshold value for the determined amount of time, the method 104 returns to block 106, where the processor 32 continues to receive electrostatic charge variation measurements from the swipe electrostatic charge sensor 30.

In a case where the processor 32 determines the electrostatic charge variation measurement is greater than the first swipe threshold value for the determined amount of time, the method 104 moves to block 110. In block 110, the processor 32 starts a first timer. The first timer is used to determine a duration of an electrostatic charge variation signal switching from a large, positive value to a large, negative value. The first timer is initialized at zero (i.e., the first timer is zero when the method 104 is started at block 106). The method 104 then moves to block 114.

In block 114, the processor 32 continues to receive electrostatic charge variation measurements from the swipe electrostatic charge sensor 30, and determines whether the electrostatic charge variation measurement is less than a second swipe threshold value for a determined amount of time. The second swipe threshold value is a configurable value (e.g., voltage level value) that is used to determine whether a user's finger is touching the negative swipe receiving electrode 28. The determined amount of time may be, for example, a time value (e.g., 0.1 seconds), a number of consecutive samples by the swipe electrostatic charge sensor 30, or a number of consecutive electrostatic charge variation measurements received in block 114. In one embodiment, the second swipe threshold value has the same absolute value of the first swipe threshold, but with negative sign.

In a case where the processor 32 determines the electrostatic charge variation measurement is not less than the second swipe threshold value for the determined amount of time, the method 104 moves to block 112. In block 112, the first timer is reset to zero in order for the first timer to be used again. The method 104 then returns to block 106, where the processor 32 continues to receive electrostatic charge variation measurements from the swipe electrostatic charge sensor 30.

In a case where the processor 32 determines the electrostatic charge variation measurement is less than the second swipe threshold value for the determined amount of time, the method 104 moves to block 116. In block 116, the processor 32 determines whether the first timer is less than a first timer threshold value.

In a case where the processor 32 determines the first timer is not less than the first timer threshold value, the method 104 moves to block 112. As discussed above, in block 112, the first timer is reset to zero in order for the first timer to be used again.

In a case where the processor 32 determines the first timer is less than the first timer threshold value, the method 104 moves to block 118. In block 118, the processor 32 detects a positive to negative swipe in which a user's finger sequentially moves across the positive swipe receiving electrode 24, the swipe ground electrode 26, and the negative swipe receiving electrode 28. The processor 32 then outputs a positive to negative swipe event indicating the detected positive to negative swipe for further processing. For example, the device 10 may perform an action (e.g., adjust volume, skip currently playing audio, fast forward or rewind audio, etc.) upon detecting the positive to negative swipe. The method 104 then moves to block 112, where the first timer is reset to zero in order for the first timer to be used again.

In block 120, the processor 32 determines whether the electrostatic charge variation measurement received in block 106 is less than a third swipe threshold value for a determined amount of time. The third swipe threshold value is a configurable value (e.g., voltage level value) that is used to determine whether a user's finger is touching the negative swipe receiving electrode 28. The determined amount of time may be, for example, a time value (e.g., 0.1 seconds), a number of consecutive samples by the swipe electrostatic charge sensor 30, or a number of consecutive electrostatic charge variation measurements received in block 106.

In a case where the processor 32 determines the electrostatic charge variation measurement is not less than the third swipe threshold value for the determined amount of time, method 104 returns to block 106, where the processor 32 continues to receive electrostatic charge variation measurements from the swipe electrostatic charge sensor 30.

In a case where the processor 32 determines the electrostatic charge variation measurement is less than the third swipe threshold value for the determined amount of time, the method 104 moves to block 122. In block 122, the processor 32 starts a second timer. The second timer is used to determine a duration of an electrostatic charge variation signal switching from a large, negative value to a large, positive value. The second timer is initialized at zero (i.e., the second timer is zero when the method 104 is started at block 106). The method 104 then moves to block 126.

In block 126, the processor 32 continues to receive electrostatic charge variation measurements from the swipe electrostatic charge sensor 30, and determines whether the electrostatic charge variation measurement is greater than a fourth swipe threshold value for a determined amount of time. The fourth swipe threshold value is a configurable value (e.g., voltage level value) that is used to determine whether a user's finger is touching the positive swipe receiving electrode 24. The determined amount of time may be, for example, a time value (e.g., 0.1 seconds), a number of consecutive samples by the swipe electrostatic charge sensor 30, or a number of consecutive electrostatic charge variation measurements received in block 114. In one embodiment, the fourth swipe threshold value has the same absolute value of the third swipe threshold, but with positive sign.

In a case where the processor 32 determines the electrostatic charge variation measurement is not greater than the fourth swipe threshold value for the determined amount of time, the method 104 moves to block 124. In block 124, the second timer is reset to zero in order for the second timer to be used again. The method 104 then returns to block 106, where the processor 32 continues to receive electrostatic charge variation measurements from the swipe electrostatic charge sensor 30.

In a case where the processor 32 determines the electrostatic charge variation measurement is greater than the fourth swipe threshold value for the determined amount of time, the method 104 moves to block 128. In block 128, the processor 32 determines whether the second timer is less than a second timer threshold value.

In a case where the processor 32 determines the second timer is not less than the second timer threshold value, the method 104 moves to block 124. As discussed above, in block 124, the second timer is reset to zero in order for the second timer to be used again.

In a case where the processor 32 determines the second timer is less than the second timer threshold value, the method 104 moves to block 130. In block 130, the processor 32 detects a negative to positive swipe in which a user's finger sequentially moves across the negative swipe receiving electrode 28, the swipe ground electrode 26, and the positive swipe receiving electrode 24. The processor 32 then outputs a negative to positive swipe event indicating the detected negative to positive swipe for further processing. For example, the device 10 may perform an action (e.g., adjust volume, skip currently playing audio, fast forward or rewind audio, etc.) upon detecting the negative to positive swipe. The method 104 then moves to block 124, where the second timer is reset to zero in order for the second timer to be used again.

The positive to negative swipe detected in block 118 and the negative to positive swipe detected in block 130 may be classified as horizontal or vertical swipes depending on the orientation of the positive swipe receiving electrode 24, the swipe ground electrode 26, and the negative swipe receiving electrode 28 on the outer surface 34 of the device 10. For example, in a case where the positive swipe receiving electrode 24, the swipe ground electrode 26, and the negative swipe receiving electrode 28 are sequentially aligned vertically on the outer surface 34 as shown in FIG. 2A, the positive to negative swipe is a vertical swipe in a downward direction. Conversely, the negative to positive swipe is a vertical swipe in an upward direction. As another example, in a case where the positive swipe receiving electrode 24, the swipe ground electrode 26, and the negative swipe receiving electrode 28 are sequentially aligned horizontally on the outer surface 34 (e.g., with the swipe ground electrode 26 positioned to the right of the positive swipe receiving electrode 24, and the negative swipe receiving electrode 28 positioned to the right of the swipe ground electrode 26), the positive to negative swipe is a horizontal swipe in a left to right direction. Conversely, the negative to positive swipe is a horizontal swipe in a right to left direction.

Although not included in the method 104, electrostatic charge variation measurements may also be resampled and filtered as discussed above with respect to the method 46 in FIG. 7. For example, blocks 50 and 52 of the method 46 may be inserted between blocks 106 and 108/120 of the method 104.

In the embodiments discussed above, the processor 32 receives electrostatic charge variation measurements from the touch electrostatic charge sensor 16, the in-ear electrostatic charge sensor 22, and the swipe electrostatic charge sensor 30; and performs touch detection, in-ear detection, and swipe detection. In other embodiments, touch detection, in-ear detection, and swipe detection are performed by the touch electrostatic charge sensor 16, the in-ear electrostatic charge sensor 22, and the swipe electrostatic charge sensor 30, themselves. For example, instead of the processor 32, the methods 46, 64, and 80 described above are executed by the touch electrostatic charge sensor 16; the method 92 described above is executed by the in-ear electrostatic charge sensor 22; and the method 104 described above is executed by the swipe electrostatic charge sensor 30.

In the embodiments discussed above, separate electrostatic charge sensors (the touch electrostatic charge sensor 16, the in-ear electrostatic charge sensor 22, and the swipe electrostatic charge sensor 30) are used for touch detection, in-ear detection, and swipe detection. In other embodiments a single electrostatic charge sensor is used for touch detection, in-ear detection, and swipe detection. In this embodiment, signals from the touch receiving electrode 12, the in-ear receiving electrode 18, and the positive swipe receiving electrode 24 and the negative swipe receiving electrode 28 are multiplexed to the single electrostatic charge sensor. When touch detection is performed, the touch receiving electrode 12 is electrically connected to the single electrostatic charge sensor; and the in-ear receiving electrode 18, the positive swipe receiving electrode 24, and the negative swipe receiving electrode 28 are electrically disconnected from the single electrostatic charge sensor. When in-ear detection is performed, the in-ear receiving electrode 18 is electrically connected to the single electrostatic charge sensor; and the touch receiving electrode 12, the positive swipe receiving electrode 24, and the negative swipe receiving electrode 28 are electrically disconnected from the single electrostatic charge sensor. When swipe detection is performed, the positive swipe receiving electrode 24 and the negative swipe receiving electrode 28 are electrically connected to the single electrostatic charge sensor; and the touch receiving electrode 12 and the in-ear receiving electrode 18 are electrically disconnected from the single electrostatic charge sensor.

The various embodiments disclosed herein provide devices and methods that utilize electrostatic charge sensors to detect various touch gestures, such as long and short touches, single/double/triple taps, and swipes; and perform in-ear detection. The electrostatic charge sensors provide an accurate, low power, and low cost solution for user input detection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

According to an embodiment disclosed herein a device comprises a receiving electrode configured to receive electrostatic charge variation; a ground electrode adjacent to the receiving electrode; an electrostatic charge sensor electrically coupled to the receiving electrode, the electrostatic charge sensor configured to measure the electrostatic charge variation; and a processor configured to: detect a touch state based on the measured electrostatic charge variation, the touch state being a state in which a user is touching the receiving electrode and the ground electrode; detect a non-touch state based on the measured electrostatic charge variation, the non-touch state being a state in which the receiving electrode is untouched by the user; and output the touch state or the non-touch state.

The device further comprises a housing including the electrostatic charge sensor and the processor, the receiving electrode and the ground electrode positioned on the same side of the housing.

The device further comprises a speaker configured to be inserted in a user's ear; and a housing including the electrostatic charge sensor, the processor, and the speaker, the receiving electrode and the ground electrode positioned opposite to the speaker.

The processor detects the touch state in a case where the measured electrostatic charge variation is greater than a first threshold value for a first determined amount of time, and detects the non-touch state in a case where the measured electrostatic charge variation is less than a second threshold value for a second determined amount of time.

The first threshold value is greater than the second threshold value.

The processor is configured to: detect a long touch event based on a duration of the touch state, the long touch event being an event in which the duration of the touch state is greater than a first threshold value; and detect a short touch event based on the duration of the touch state, the short touch event being an event in which the duration of the touch state is less than a second threshold value.

The processor is configured to detect two or more taps based on a number of the short touch events that are detected within a threshold amount of time of each other.

The receiving electrode includes a first plurality of extensions extending in a first direction, the ground electrode includes a second plurality of extensions extending in the first direction, the first plurality of extensions and the second plurality of extensions are aligned with each other in a second direction transverse to the first direction, and at least one of the second plurality of extensions is positioned between two of the first plurality of extensions.

The non-touch state is a state in which the receiving electrode and the ground electrode are untouched by the user.

According to an embodiment disclosed herein a method comprises receiving, by a receiving electrode, electrostatic charge variation, the receiving electrode being positioned next to a ground electrode; measuring, by an electrostatic charge sensor, the electrostatic charge variation; detecting a first input state selected from a touch state and a non-touch state based on the measured electrostatic charge variation, the touch state being a state in which a user is touching the receiving electrode and the ground electrode, the non-touch state being a state in which the receiving electrode and the ground electrode are untouched by the user; and outputting the first input state.

The first input state is detected as the touch state in a case where the measured electrostatic charge variation is greater than a first threshold value, and detected as the non-touch state in a case where the measured electrostatic charge variation is less than a second threshold value.

The first threshold value is greater than the second threshold value.

In a case where the first input state is the touch state, the method further includes detecting a second input state selected from a long touch event and a short touch event based on a duration of the touch state, the long touch event being an event in which the duration of the touch state is greater than a first threshold value, the short touch event being an event in which the duration of the touch state is less than a second threshold value.

In a case where the second input state is the short touch event, the method further includes detecting two or more taps based on a number of the short touch events that are detected within a threshold amount of time of each other.

The detecting and outputting are performed by the electrostatic charge sensor.

According to an embodiment disclosed herein audio device comprises a speaker; a receiving electrode configured to receive electrostatic charge variation; a ground electrode adjacent to the receiving electrode; and an electrostatic charge sensor electrically coupled to the receiving electrode. The electrostatic charge sensor configured to: measure the electrostatic charge variation; detect an in-ear state based on the measured electrostatic charge variation, the in-ear state being a state in which the speaker is inserted into a user's ear and the user's ear is touching the receiving electrode and the ground electrode; detect an out-of-ear state based on the measured electrostatic charge variation, the out-of-ear state being a state in which the speaker is not inserted into the user's ear; and output the in-ear state or the out-of-ear state.

The receiving electrode and the ground electrode are positioned on the same side of the device.

The receiving electrode and the ground electrode face the user's ear while the speaker is inserted into the user's ear.

The electrostatic charge sensor detects the in-ear state in a case where the measured electrostatic charge variation is greater than or equal to a threshold value for a determined amount of time, and detects the out-of-ear state in a case where the measured electrostatic charge variation is smaller than the threshold value for the determined amount of time.

According to an embodiment disclosed herein a method for an audio device comprises receiving, by a receiving electrode, electrostatic charge variation, the receiving electrode being positioned next to a ground electrode electrically coupled to ground; measuring, by an electrostatic charge sensor, the electrostatic charge variation; detecting an input state selected from an in-ear touch state and an out-of-ear state based on the measured electrostatic charge variation, the in-ear state being a state in which the audio device is inserted into a user's ear and the user's ear is touching the receiving electrode and the ground electrode, the out-of-ear state being a state in which the audio device is not inserted into the user's ear; and outputting the input state.

The input state is detected as the in-ear state in a case where the measured electrostatic charge variation is a large signal, and detected as the out-of-ear state in a case where the measured electrostatic charge variation is small signal that is smaller than the large signal.

The input state is detected as the in-ear state in a case where the measured electrostatic charge variation is greater than or equal to a threshold value for a determined amount of time, and detected as the out-of-ear state in a case where the measured electrostatic charge variation is less than the threshold value for the determined amount of time.

The input state is detected as the out-of-ear state in a case where the in-ear state was previously detected.

The detecting and outputting are performed by the electrostatic charge sensor.

According to an embodiment disclosed herein a device, comprises a first receiving electrode configured to receive first electrostatic charge variation; a ground electrode electrically coupled to ground; a second receiving electrode configured to receive second electrostatic charge variation, the second receiving electrode being spaced from the first receiving electrode by the ground electrode; and an electrostatic charge sensor electrically coupled to the first receiving electrode and the second receiving electrode. The electrostatic charge sensor is configured to generate an electrostatic charge variation measurement using the first electrostatic charge variation and the second electrostatic charge variation; detect a first swipe state based on the electrostatic charge variation measurement, the first swipe state being a state in which a user's finger moves in a first direction; detect a second swipe state based on the electrostatic charge variation measurement, the second swipe state being a state in which a user's finger moves in a second direction opposite to the first direction; and output the first swipe state or the second swipe state.

The device further comprises a housing including the electrostatic charge sensor, the first receiving electrode, the ground electrode, and the second receiving electrode positioned on the same side of the housing.

The device further comprises a speaker configured to be inserted in a user's ear; and a housing including the electrostatic charge sensor and the speaker, the first receiving electrode, the ground electrode, and the second receiving electrode positioned opposite to the speaker.

The electrostatic charge sensor detects the first swipe state in a case where the electrostatic charge variation measurement transitions from a positive value to a negative value, and detects the second swipe state in a case where the electrostatic charge variation measurement transitions from a negative value to a positive value.

The electrostatic charge sensor detects the first swipe state in a case where the electrostatic charge variation measurement transitions from a first value greater than a first threshold value to a second value less than a second threshold value, and detects the second swipe state in a case where the electrostatic charge variation measurement transitions from a third value less than a third threshold value to a fourth value greater than a fourth threshold value.

The first threshold value is greater than the second threshold value, and the third threshold value is less than the fourth threshold value.

According to an embodiment disclosed herein a method comprises receiving, by a first receiving electrode, a first electrostatic charge variation; receiving, by a second receiving electrode, a second electrostatic charge variation, the second receiving electrode being spaced from the first receiving electrode by a ground electrode; generating, by an electrostatic charge sensor, an electrostatic charge variation measurement using the first electrostatic charge variation and the second electrostatic charge variation; detecting an input state selected from a first swipe state and a second swipe state based on the electrostatic charge variation measurement, the first swipe state being a state in which a user's finger moves in a first direction, the second swipe state being a state in which a user's finger moves in a second direction opposite to the first direction; and output the input state.

The input state is detected as the first swipe state in a case where the electrostatic charge variation measurement transitions from a positive value to a negative value, and detected as the second swipe state in a case where the electrostatic charge variation measurement transitions from a negative value to a positive value.

The input state is detected as the first swipe state in a case where the electrostatic charge variation measurement transitions from a first value greater than a first threshold value to a second value less than a second threshold value, and detected as the second swipe state in a case where the electrostatic charge variation measurement transitions from a third value less than a third threshold value to a fourth value greater than a fourth threshold value.

The detecting and outputting are performed by the electrostatic charge sensor.

The invention claimed is:

1. A device, comprising:
a receiving electrode positioned on a surface of the device and configured to receive electrostatic charge variation;
a ground electrode positioned on the surface of the device and adjacent to the receiving electrode;
an electrostatic charge sensor electrically coupled to the receiving electrode, the electrostatic charge sensor configured to measure the electrostatic charge variation; and
a processor configured to:
detect a touch state based on the measured electrostatic charge variation, the touch state being a state in which a user is touching both of the receiving electrode and the ground electrode;
detect a non-touch state based on the measured electrostatic charge variation, the non-touch state being a state in which the receiving electrode is untouched by the user; and
output the touch state or the non-touch state.

2. The device of claim 1, further comprising:
a housing including the electrostatic charge sensor and the processor, the receiving electrode and the ground electrode positioned on the same side of the housing.

3. The device of claim 1, further comprising:
a speaker configured to be inserted in a user's ear; and
a housing including the electrostatic charge sensor, the processor, and the speaker, the receiving electrode and the ground electrode positioned opposite to the speaker.

4. The device of claim 1 wherein the processor detects the touch state in a case where the measured electrostatic charge variation is greater than a first threshold value for a first determined amount of time, and detects the non-touch state in a case where the measured electrostatic charge variation is less than a second threshold value for a second determined amount of time.

5. The device of claim 4 wherein the first threshold value is greater than the second threshold value.

6. The device of claim 1 wherein the processor is configured to:
- detect a long touch event based on a duration of the touch state, the long touch event being an event in which the duration of the touch state is equal to a first threshold value; and
- detect a short touch event based on the duration of the touch state, the short touch event being an event in which the duration of the touch state is less than a second threshold value.

7. The device of claim 6 wherein the processor is configured to detect two or more taps based on a number of the short touch events that are detected within a threshold amount of time of each other.

8. The device of claim 1 wherein the receiving electrode includes a first plurality of extensions extending in a first direction, the ground electrode includes a second plurality of extensions extending in the first direction, the first plurality of extensions and the second plurality of extensions are aligned with each other in a second direction transverse to the first direction, and at least one of the second plurality of extensions is positioned between two of the first plurality of extensions.

9. The device of claim 1 wherein the non-touch state is a state in which the receiving electrode and the ground electrode are untouched by the user.

10. A method, comprising:
- receiving, by a receiving electrode on a surface of a device, electrostatic charge variation, the receiving electrode being positioned next to a ground electrode on the surface of the device;
- measuring, by an electrostatic charge sensor, the electrostatic charge variation;
- detecting a first input state selected from a touch state and a non-touch state based on the measured electrostatic charge variation, the touch state being a state in which a user is touching both of the receiving electrode and the ground electrode, the non-touch state being a state in which the receiving electrode and the ground electrode are untouched by the user; and
- outputting the first input state.

11. The method of claim 10 wherein the first input state is detected as the touch state in a case where the measured electrostatic charge variation is greater than a first threshold value, and detected as the non-touch state in a case where the measured electrostatic charge variation is less than a second threshold value.

12. The method of claim 11 wherein the first threshold value is greater than the second threshold value.

13. The method of claim 10 wherein, in a case where the first input state is the touch state, the method further includes:
- detecting a second input state selected from a long touch event and a short touch event based on a duration of the touch state, the long touch event being an event in which the duration of the touch state is equal to a first threshold value, the short touch event being an event in which the duration of the touch state is less than a second threshold value.

14. The method of claim 13 wherein, in a case where the second input state is the short touch event, the method further includes:
- detecting two or more taps based on a number of the short touch events that are detected within a threshold amount of time of each other.

15. The method of claim 14 wherein the detecting and outputting are performed by the electrostatic charge sensor.

16. An audio device, comprising:
- a speaker;
- a receiving electrode configured to receive electrostatic charge variation;
- a ground electrode adjacent to the receiving electrode, the receiving electrode and the ground electrode being positioned on a surface of the audio device; and
- an electrostatic charge sensor electrically coupled to the receiving electrode, the electrostatic charge sensor configured to:
- measure the electrostatic charge variation;
- detect an in-ear state based on the measured electrostatic charge variation, the in-ear state being a state in which the speaker is inserted into a user's ear and the user's ear is touching both of the receiving electrode and the ground electrode;
- detect an out-of-ear state based on the measured electrostatic charge variation, the out-of-ear state being a state in which the speaker is not inserted into the user's ear; and
- output the in-ear state or the out-of-ear state.

17. The audio device of claim 16 wherein the receiving electrode and the ground electrode are positioned on the same side of the device.

18. The audio device of claim 16 wherein the receiving electrode and the ground electrode face the user's ear while the speaker is inserted into the user's ear.

19. The audio device of claim 16 wherein the electrostatic charge sensor detects the in-ear state in a case where the measured electrostatic charge variation is greater than or equal to a threshold value for a determined amount of time, and detects the out-of-ear state in a case where the measured electrostatic charge variation is smaller than the threshold value for the determined amount of time.

* * * * *